(12) United States Patent
Ohashi

(10) Patent No.: US 6,187,503 B1
(45) Date of Patent: Feb. 13, 2001

(54) LITHOGRAPHIC PRINTING PLATE

(75) Inventor: Yoshihito Ohashi, Tokyo (JP)

(73) Assignee: Mitsubishi Paper Mills Limited, Tokyo (JP)

( * ) Notice: Under 35 U.S.C. 154(b), the term of this patent shall be extended for 0 days.

(21) Appl. No.: 09/460,394

(22) Filed: Dec. 13, 1999

(30) Foreign Application Priority Data

Dec. 14, 1998 (JP) .................................. 10-354522

(51) Int. Cl.[7] ............... G03F 7/07; G03C 8/28; G03C 8/06; G03C 8/52
(52) U.S. Cl. .................. 430/232; 430/204; 430/227
(58) Field of Search ................... 430/204, 232, 430/227

(56) References Cited

U.S. PATENT DOCUMENTS

| | | | |
|---|---|---|---|
| 5,068,165 | * 11/1991 | Coppens et al. | 430/204 |
| 5,108,871 | * 4/1992 | Yamano et al. | 430/204 |
| 5,731,124 | * 3/1998 | Jonckheere et al. | 430/204 |
| 5,853,950 | * 12/1998 | Kondo et al. | 430/204 |

* cited by examiner

*Primary Examiner*—Richard L Schilling
(74) *Attorney, Agent, or Firm*—Pillsbury Madison & Sutro LLP

(57) ABSTRACT

There is disclosed a lithographic printing plate which comprises a grained and anodized aluminum support, a silver halide emulsion layer and a physical development nuclei layer between the aluminum support and the silver halide emulsion layer, and at least one selected from the group consisting of a phosphoric acid compound having a polyoxyalkylene unit and a water-soluble vinyl polymer having a carboxylic acid ester group being contained between the aluminum support and the silver halide emulsion layer.

10 Claims, No Drawings

LITHOGRAPHIC PRINTING PLATE

BACKGROUND OF THE INVENTION

This invention relates to a lithographic printing plate, more specifically to a lithographic printing plate using a silver complex diffusion transfer process.

With regard to a lithographic printing plate using a silver complex diffusion transfer process (the DTR method), some examples are described on pages 101 to 130 of André Rott and Edith Weyde, "Photographic Silver Halide Diffusion Processes", published by the Focal Press, London and New York (1972).

As described therein, there have been known two kinds of lithographic printing plates using the DTR process, i.e., a two sheet type in which a transfer material and an image-receiving material are separated and a mono-sheet type in which these materials are provided on one support. The two sheet type lithographic printing plate is described in detail in Japanese Provisional Patent Publication No. 158844/1982. Also, the mono-sheet type is described in detail in U.S. Pat. No. 3,728,114.

In a lithographic printing plate using paper as a support, a high quality printing including printing endurance is difficult due to elongation of the plate during printing or soaking of water. In order to solve these problems and to improve printing characteristics, a film support is used. As such a film support, there may be used, for example, a cellulose acetate film, a polyvinyl acetal film, a polystyrene film, a polypropylene film, a polyethylene terephthalate film, or a composite film in which a polyester, polypropylene or polystyrene film, etc. is/are covered by a polyethylene film. However, the lithographic printing plate using a film as a support is improved in elongation property of the printing plate or soaking of water, but there remains problems such as printing endurance, water retaining property, and further mounting property to a printing machine, etc.

Thus, in order to solve the various problems involved in the lithographic printing plate using paper or a film as mentioned above, there have been known a silver complex salt system lithographic printing plate using a metal, particularly an aluminum plate as the support. They are described in detail in Japanese Provisional Patent Publications No. 118244/1982, No. 158844/1982, No. 260491/1988, No. 116151/1991 and No. 282295/1992 and U.S. Pat. Nos. 4,567,131 and 5,427,889. In the above mono-sheet type lithographic printing plates using the silver complex diffusion transfer process which employ an aluminum plate as a support (hereinafter referred to as "an aluminum lithographic printing plate"), a physical development nuclei layer is provided on a grained and anodized aluminum support, and a silver halide emulsion layer is further provided thereon. A general process for making the lithographic printing plate comprises the steps of exposure, development processing, water washing processing (washing off: removal of a silver halide emulsion layer, hereinafter merely referred to as "washing processing"). Moreover, for protecting the lithographic printing surface, finishing processing is usually carried out.

Specifically, metallic silver image portions are formed on the physical development nuclei by development processing, and by washing processing subsequent thereto, a silver halide emulsion layer is removed to expose the metallic silver image portions (hereinafter referred to as "silver image portions") on an aluminum support. Simultaneously, the surface of the anodized aluminum itself is exposed as non-image portions. In the aluminum lithographic printing plate which is the object of the present invention, printing endurance is remarkably improved as compared with the silver salt printing plate using a paper support or a plastic support as mentioned above, but printing endurance of 150,000 sheets or more cannot yet be obtained stably and further improvement is desired.

On the other hand, in the aluminum support to be used in the present invention, graining and anodizing are carried out on the surface of the aluminum support in order to improve adhesiveness with the silver image portions formed on the surface thereof and to improve water retention property. In this roughening treatment (so-called graining), there are mechanical roughening treatments such as ball graining, wire graining, brushgraining, etc., chemical roughening treatments which are carried out by chemically dissolving aluminum with a chloride, a fluoride, etc., and electrolytic roughening treatments in which aluminum is electrochemically dissolved. Moreover, treatments such as desmutting treatment, post treatment, etc. are usually carried out.

With regard to surface treatment of an aluminum support for lithographic printing plate, a large number of roughened aluminum plates different in shape, structure, etc. of the roughened surface have been proposed depending on the purpose of printing. For example, there is disclosed an aluminum support in which the relationship between an amount of an anodized film and a surface roughness is specified in Japanese Provisional Patent Publication No. 260491/1988, and an aluminum support in which the surface shape is specified in Japanese Provisional Patent Publication No. 64293/1995. Also, there is disclosed that printing characteristics are markedly affected by a plateau (primary structure) and pit (secondary structure formed on the surface of the plateau) which are formed by using mechanical roughening and chemical etching as well as electrolytic roughening in combination in Japanese Provisional Patent Publication No. 28893/1981.

In the field of a PS plate (a pre-sensitized plate) using a photosensitive resin, various kinds of aluminum supports which are similarly roughened and anodized have been proposed and supplied from many manufacturers.

The surface shape of the above-mentioned aluminum support is determined by the combination of many conditions such as the conditions of the roughening treatments, chemical roughening treatments or electrolytic roughening treatments, the conditions of anodization, the alloy composition of the aluminum plate and the like, and it can be easily expected that printing characteristics such as ink receptivity, printing endurance, etc. are fluctuated depending on these various conditions. Particularly, the lithographic printing plate utilizing the silver complex diffusion transfer method which is an object of the present invention is easily affected by a subtle difference between the date of the manufacture (difference between lots) even when the aluminum supports prepared by the same preparation conditions are used. Accordingly, a lithographic printing plate using a silver complex diffusion transfer process which is not affected by the surface shape and the surface treatment of an aluminum plate and gives high printing characteristics stably has been earnestly desired.

SUMMARY OF THE INVENTION

An object of the present invention is to provide a lithographic printing plate using a silver complex diffusion transfer process in which high printing endurance can be obtained stably.

Another object of the present invention is to provide a lithographic printing plate using a silver complex diffusion transfer process which is difficultly affected by subtle fluctuation of the conditions such as surface treatment, etc. during the preparation process of the aluminum support and is excellent in printing endurance and ink receptivity.

The above-mentioned objects of the present invention has been accomplished by the lithographic printing plate which comprises a grained and anodized aluminum support, a silver halide emulsion layer and physical development nuclei provided therebetween, and at least one selected from the group consisting of a phosphoric acid compound having a polyoxyalkylene unit and a water-soluble vinyl polymer having a carboxylic acid ester group being contained between said aluminum support and said silver halide emulsion layer.

DESCRIPTION OF THE PREFERRED EMBODIMENTS

The present invention will be explained in more detail below.

The phosphoric acid compound having a polyoxyethylene unit to be used in the present invention is represented by the following formula (I):

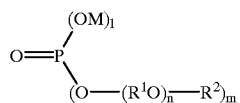

wherein $R^1$ represents an alkylene group having 2 to 6 carbon atoms; $R^2$ represents an alkyl group having 5 to 20 carbon atoms, an alkenyl group, an alkynyl group or an aryl group which may have a substituent; M represents a hydrogen atom, an alkali metal or an ammonium group; l is an integer of 0, 1 or 2; m is an integer of 1 to 3; l+m=3; and n is an integer of 2 to 30; and when l or m is 2 or more, the respective $R^1$, $R^2$, M and n may be the same or different from each other.

The polyoxyalkylene unit of the phosphoric acid compound having a polyoxyethylene unit to be used in the present invention is a polyoxyalkylene having 2 to 6 alkylene carbon atoms, preferably 2 to 4 alkylene carbon atoms, more preferably 2 or 3 alkylene carbon atoms. More specifically, it is preferably polyoxyethylene, polyoxypropylene and polyoxybutylene, more preferably polyoxyethylene. Also, it may contain a block or random unit of polyoxyethylene, polyoxypropylene and polyoxybutylene. The polyoxyalkylene unit of the present invention binds at one end to an alkyl group or an aryl group through an ether linkage, and the other end thereof binds to phosphoric acid. That is, the compound is a polyoxyalkylene alkyl or aryl ether of a phosphoric acid (or a salt thereof). The alkyl group of said alkyl ether is preferably a straight alkyl group having 5 to 20 carbon atoms which may be substituted by a group having an unsaturated group. The aryl group of said aryl ether may include a phenyl group, a naphthyl group and the like, which may have at least one substituent such as an alkyl group, a sulfonic acid group and the like. The number of the polyoxyalkylene unit is preferably 2 to 30, more preferably 2 to 20. In the phosphoric acid compound having a polyoxyalkylene unit, the compound may include a phosphoric acid compound having one polyoxyalkylene unit as well as a phosphoric acid compound having two or three polyoxyalkylene units. When two or more polyoxyalkylene units are bound to the phosphoric acid, the plural number of the polyoxyalkylene units may be the same or different from each other. The phosphoric acid may be in the form of a salt such as an alkali metal salt, for example, a sodium salt and a potassium salt.

Specific phosphoric acid compound to be used in the present invention may include, for example, as mentioned below. Incidentally, the numeral in the parentheses shows the number of the polyoxyethylene (hereinafter abbreviated to as "POE") unit. Sodium POE(10) lauryl ether phosphate, sodium POE(4) lauryl ether phosphate, sodium POE(5) cetyl ether phosphate, sodium POE(8) oleyl ether phosphate, diPOE(2) dodecyl ether phosphate, diPOE(4) oleyl ether phosphate, diPOE(4) nonyl phenyl ether phosphate, diPOE (6) dodecyl ether phosphate, diPOE(8) dodecyl ether phosphate, diPOE(10) dodecyl ether phosphate, triPOE(2) lauryl ether phosphate, triPOE(6) dodecyl ether phosphate, triPOE(8) dodecyl ether phosphate, triPOE(10) dodecyl ether phosphate, and diPOE(4) nonyl ether phosphate.

Next, the water-soluble vinyl polymer having a carboxylic acid ester group to be used in the present invention is explained. The water-soluble vinyl polymer having a carboxylic acid ester group to be used in the present invention is represented by the following formula (II):

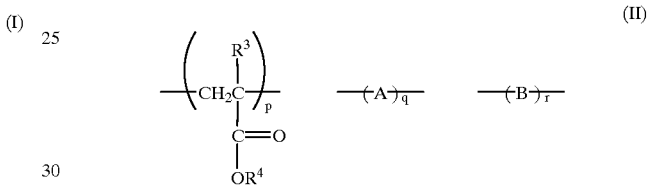

wherein $R^3$ represents a hydrogen atom or a methyl group; $R^4$ represents a straight or branched alkyl group having 1 to 20 carbon atoms or an aryl group; A represents a vinyl monomer unit having a carboxyl group, a sulfo group, a hydroxyl group, or a salt thereof, or an amide group at the side chain; B represents a copolymerizable monomer unit; p is 10 to 90% by weight; q is 90 to 10% by weight and r is 0 to 50% by weight.

One of the embodiments of said polymer is a copolymer of a vinyl monomer having a carboxylic acid ester group and a water-soluble vinyl monomer. It is important that the polymer is water-soluble and the term "water-soluble" in the present specification means that the polymer dissolves in water at 25° C. in an amount of 1% by weight or more.

As the vinyl monomer having a carboxylic acid ester group which constitutes said polymer, there may be mentioned, for example, an acrylic acid ester (e.g., methyl acrylate, ethyl acrylate, propyl acrylate, butyl acrylate, t-butyl acrylate, amyl acrylate, hexyl acrylate, octyl acrylate, etc.), an α-substituted acrylic acid ester (e.g., a methacrylic acid ester such as methyl methacrylate, ethyl methacrylate, propyl methacrylate, butyl methacrylate, 2-ethylhexyl methacrylate, etc.). Among these, as analkyl group which forms an ester group, an alkyl group having 1 to 10 carbon atoms is preferred, more preferably 1 to 8 carbon atoms, particularly preferably 1 to 6 carbon atoms. Said alkyl group may be a straight or branched.

As the water-soluble monomer which constitutes said polymer, there may be mentioned, for example, a vinyl monomer having, at the side chain, a carboxyl group, a sulfo group, a hydroxyl group or a salt thereof, or an amide group. For example, there may be mentioned acrylamide (such as acrylamide, methacrylamide, butyl acrylamide, hexyl acrylamide, etc.), acrylic acid, methacrylic acid, itaconic acid, maleic acid, styrene sulfonic acid, hydroxyalkyl acrylate or methacrylate (such as hydroxyethyl acrylate, hydroxypropyl acrylate, hydroxyethyl methacrylate, hydroxypropyl methacrylate, etc.), and a salt thereof.

Also available is a graft polymer of the above-mentioned vinyl monomer with a water-soluble polymer such as a polyvinyl alcohol. This polymer can be obtained by copolymerizing the above-mentioned vinyl monomer having a carboxylic acid ester group and the water-soluble vinyl monomer in the presence of a polyvinyl alcohol.

In the other embodiment of the polymer according to the present invention, said polymer can be produced by subjecting a polymer containing acid anhydride such as maleic anhydride, etc. to wholly or partially half-esterification to introduce the carboxylic acid ester group and the carboxylic acid group. More specifically, the polymer is a water-soluble polymer having the monomer unit represented by the following formula (III):

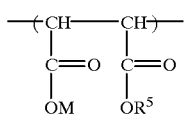

(III)

wherein $R^5$ has the same meaning as $R^4$; and M has the same meaning as defined above.

In the polymer to be used in the present invention, other copolymerizable monomers may be introduced so long as they do not impair the property of the lithographic printing plate of the present invention. Such a copolymerizable monomer may include, for example, styrene derivatives including an alkyl-substituted styrene such as methyl, ethyl, etc. and an alkoxy-substituted styrene such as methoxy, ethoxy, etc.; vinyl esters such as vinyl acetate, vinyl propionate, vinyl benzoate, vinyl butyrate, etc.; acrylic acid or methacrylic acid derivatives such as acrylonitrile, methacrylonitrile, etc.; vinyl methyl ether derivatives; vinyl ketones such as vinyl methyl ketone, vinyl hexyl ketone, methyl isopropenyl ketone, etc.; vinyl naphthalene derivatives; allyl compounds such as allyl phenyl ether, allyl benzene, etc.; maleimide derivatives such as N-phenylmaleimide, etc.

The molecular weight of the polymer to be used in the present invention is preferably in a weight average molecular weight about 5,000 to about 1,000,000, more preferably about 10,000 to about 500,000. Also, the ratio of the recurring unit having a carboxylic acid ester group in the polymer is preferably 10% by weight to 90% by weight, more preferably 20% by weight to 80% by weight.

As the polymer to be used in the present invention, preferably used is a copolymer of a vinyl monomer having a carboxylic acid ester group and a water-soluble vinyl monomer, particularly preferably a copolymer of an acrylate or methacrylate and an acrylic acid or methacrylic acid.

As the method for containing the phosphoric acid compound having a polyoxyalkylene unit or the water-soluble polymer having a carboxylic acid ester group as mentioned above between the aluminum support and the silver halide emulsion layer, it is preferred the method that the phosphoric acid compound having a polyoxyalkylene unit or the water-soluble polymer having a carboxylic acid ester group is mixed with physical development nuclei and the mixture is coated when the physical development nuclei layer is provided in view of shorten the step. However, by the method in which the phosphoric acid compound having a polyoxyalkylene unit or the water-soluble polymer having a carboxylic acid ester group is coated before or after coating the physical development nuclei, the same effect as mentioned above can be obtained. The coating amount of the phosphoric acid compound having a polyoxyalkylene unit or the water-soluble polymer having a carboxylic acid ester group is preferably 0.10 to 200 mg/m$^2$, more preferably 1 to 20 mg/m$^2$. If the amount is less than 0.10 mg/m$^2$, desired effects cannot sometimes be obtained, while if it exceeds 200 mg/m$^2$, image quality becomes undesirably poor.

As the physical development nuclei in a physical development nuclei layer to be used in the present invention, known physical development nuclei used in the silver complex diffusion transfer process may be used. As an example thereof, there may be used a colloid of gold, silver or the like, a metal sulfide obtained by mixing a water-soluble salt of palladium, zinc and the like with a sulfide, and so on. As a protective colloid, various hydrophilic colloids may be used. With respect to details of the physical development nuclei and preparation process thereof, reference can be made to, for example, André Rott and Edith Weyde, "Photographic Silver Halide Diffusion Processes", published by the Focal Press, London and New York (1972).

In the physical development nuclei layer of the lithographic printing plate according to the present invention, various kinds of surfactants such as natural surfactants including saponin, etc.; nonionic surfactants including an alkylene oxide series, glycerin series, glycidol series ones; cationic surfactants including a higher alkylamine, a quaternary ammonium salt, pyridine and other heterocyclic materials, and sulfonium; anionic surfactants having an acidic group such as a carboxylic acid group, a sulfonic acid group and sulfuric acid ester group; ampholytic surfactants including amino acids, aminosulfonic acids, sulfuric acid or phosphoric acid ester of amino alcohol, etc.; fluorine series anionic or ampholytic surfactants containing fluorine and the like may be used.

A light-sensitive silver halide emulsion to be used in the present invention is selected from generally used silver chloride, silver bromide, silver iodide, silver chlorobromide, silver chloroiodobromide, silver iodobromide and so on. The type of the emulsion may be either negative type or positive type. The above silver halide emulsion can be chemically sensitized by noble metal sensitization, sulfur sensitization, reduction sensitization, and a sensitization in which the above sensitizations are employed in combination; or spectrally sensitized by using a sensitizing dye such as cyanine, melocyanine, etc., if necessary. Moreover, said silver halide emulsion may contain a usual stabilizer such as a heterocyclic compound including, for example, mercaptotriazole, etc. Also, other components such as an antifoggant, a developer and/or a development accelerator, and a wetting agent, etc. may be contained. Said compound(s) may be contained in a constitutional layer in combination with some other compound having a mercapto group or a thione group.

As a protective colloid of the silver halide emulsion layer, various kinds of gelatins such as acid-treated gelatin, alkali-treated gelatin, gelatin derivatives, grafted gelatin, etc. may be used. In addition, a hydrophilic high molecular weight compound such as polyvinyl pyrrolidone, various starches, albumin, polyvinyl alcohol, gum arabic, hydroxyethyl cellulose and the like may be contained. As the hydrophilic colloid to be used, a hydrophilic colloid substantially containing no hardener is desirably used in order to facilitate peeling of the hydrophilic colloid layer after physical development.

The developing solution to be used in the present invention may contain additives including a developing agent such as a polyhydroxybenzene or a 3-pyrazolidinone; an alkaline substance such as potassium hydroxide, sodium hydroxide, lithium hydroxide, sodium tertiary phosphate and an amine compound; a preservative such as sodium sulfite; a viscosity modifier such as carboxymethyl cellulose; an antifoggant such as potassium bromide and 1-phenyl-5-mercaptotetrazole; and a development modifier such as a polyoxyalkylene compound.

A pH of the developing solution is generally about 10 to 14, preferably about 12 to 14, but it may vary depending on the pre-treatment conditions (e.g., anodization conditions) of the aluminum support for the lithographic printing plate to be used, photographic elements, desired images, kinds and amounts of various compounds in the developing solution, development conditions, etc.

The wash-off for removing the gelatin layer can be carried out by washing away with flow water at a temperature of 20 to 30° C.

EXAMPLES

In the following, the present invention is explained in detail by referring to Examples, but the present invention is not limited by the following Examples so long as not exceeding the scope of the present invention.

Example

According to the method described in Example 1 of Japanese Provisional Patent Publication No. 21602/1978, an aluminum support was prepared by controlling the current and voltage conditions to become an anodized film amount of 2.5 g±0.2 g/m² and a surface roughness of 0.4±0.05 μm. Preparation of the aluminum support is carried out over 10 days with 10 m² per day and 10 lots in total of aluminum supports were prepared with 1 lot per day.

To the 10 lots of the aluminum supports were each coated the physical development nuclei solution mentioned above and dried.

<Physical Development Nuclei Solution>

By using palladium sulfide as physical development nuclei and any one of the compounds (1) to (5) shown below to become coating amounts of 3 mg/m² and 10 mg/m², respectively, physical development nuclei solutions A (containing Compound (1)), B (containing Compound (2)), C (containing Compound (3)), D (containing Compound (4)) and E (containing Compound (5)) were prepared. As comparative purposes, physical development nuclei solutions containing 3 mg/m² of palladium sulfide and 10 mg/m² of any one of compounds selected from polyethylene glycol (molecular weight: 200, physical development nuclei solution F), poly(methyl methacrylate) (hydrophobic beads, molecular weight: 100,000, physical development nuclei solution G), and poly(vinyl pyrrolidone) (molecular weight: 50,000, physical development nuclei solution H) were prepared, respectively.

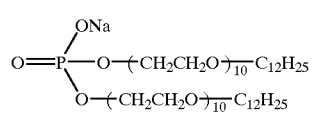

Compound (1)

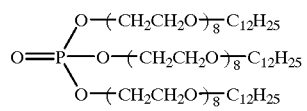

Compound (2)

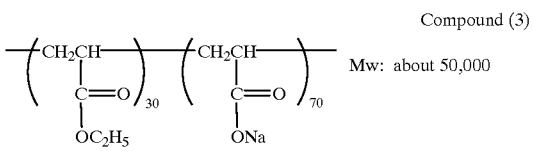

Compound (3) Mw: about 50,000

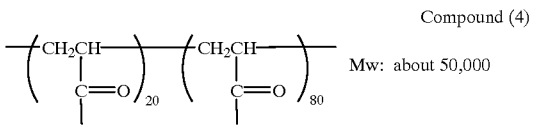

Compound (4) Mw: about 50,000

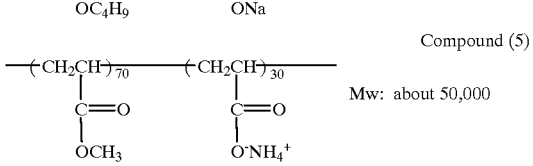

Compound (5) Mw: about 50,000

Next, a silver halide emulsion layer was prepared as mentioned below.

<Silver Halide Emulsion Layer>

As a silver halide emulsion, a silver chloroiodobromide emulsion (AgBr 20 mole %, AgI 0.4 mole %) having an average particle size of 0.2 μm to which 0.006 mmole of potassium hexachloro irridate (IV) was doped per mole of silver was prepared by the control double jet method. Moreover, the emulsion was subjected to sulfur-gold sensitization and then spectrally sensitized by using 3 mg of Compound (6) shown below per 1 g of silver.

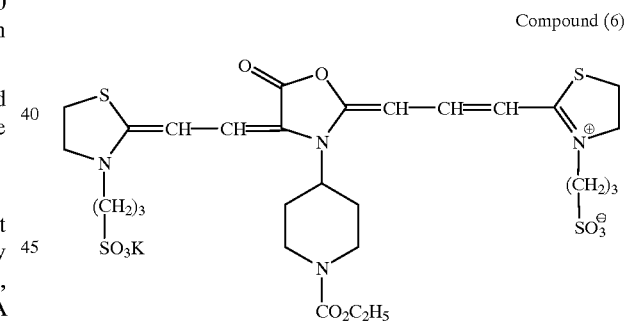

Compound (6)

To the thus prepared silver halide emulsion was added a surfactant, and the silver halide emulsion was coated with a silver amount of 2 g/m² on the respective aluminum supports to the surface of which are coated the above-mentioned respective physical development nuclei and dried to obtain lithographic printing plate precursors.

The above-mentioned lithographic printing plate precursors were each image-output by an output machine using a red LD laser with 633 nm as a light source, and then, treated by a processor (SLT-85N automatic developer, trade name, manufactured by Du'Pont de Nemours) for making a plate to prepare lithographic printing plates. The plates were made by subjecting to developing treatment for 12 seconds, washing treatment (the emulsion layer was washed off by a scrub roller while shower jetting washing solution at 35° C. for 10 seconds), finishing treatment (21° C. for 5 seconds shower) and drying step. For the developing treatment, the following developing solution was used.

<Developing solution>

| | |
|---|---|
| Hydroquinone | 20 g |
| Phenidone | 3 g |
| Sodium sulfite | 100 g |
| EDTA | 2 g |
| Sodium thiosulfate | 8 g |
| Sodium hydroxide | 25 g |
| N-methylethanolamine | 50 g |
| Styrene sulfonic acid-maleic anhydride copolymer (Weight average molecular weight: 500,000) | 10 g |

Made up to 1000 cc with addition of water.
The solution was finally adjusted to pH = 13.3 (25° C.).

These lithographic printing plates thus prepared were each mounted on a printing press Heidelberg KORD (trade name, an offset printing press available from Heidelberg Co.) and printing was carried out by using New Champion Black N (trade name, available from Dainippon Ink Co.) as an ink and a commercially available dampening solution for PS plate, and ink receptivity and printing endurance were evaluated.

The ink receptivity was evaluated by contacting an ink roller to the plate surface and simultaneously starting feed of paper, and counting the number of papers until a printed material with good image density can be obtained. The printing endurance was evaluated by counting the number of papers until when printing becomes impossible due to ink failure at the image portion or causing lack of line(s). The results are shown in Table 1.

TABLE 1

| Physical development nuclei solution | Evaluation of printing characteristics during 10 lots | | |
|---|---|---|---|
| | Printing endurance | Ink receptivity | Remarks |
| A | 150,000 sheets or more in all lots | 15 sheet or less in all lots | Present invention |
| B | 150,000 sheets or more in all lots | 15 sheet or less in all lots | Present invention |
| C | 150,000 sheets or more in all lots | 15 sheet or less in all lots | Present invention |
| D | 150,000 sheets or more in all lots | 15 sheet or less in all lots | Present invention |
| E | 150,000 sheets or more in all lots | 15 sheet or less in all lots | Present invention |
| F | 20,000 to 100,000 sheets | 30 to 50 sheets | Comparative |
| G | 20,000 to 100,000 sheets | 30 to 50 sheets | Comparative |
| H | 20,000 to 100,000 sheets | 30 to 50 sheets | Comparative |

As can be seen from the above results, it can be understood that the lithographic printing plate of the present invention can give stable and high printing endurance and ink receptivity without being affected by subtle fluctuation in treatment conditions different in the respective production lots of aluminum supports.

What is claimed is:

1. A lithographic printing plate comprising a grained and anodized aluminum support, a silver halide emulsion layer and a physical development nuclei layer provided between said aluminum support and said silver halide emulsion layer, and at least one selected from the group consisting of a phosphoric acid compound having a polyoxyalkylene unit, a water-soluble vinyl polymer having a carboxylic acid ester group represented by the following formula (II):

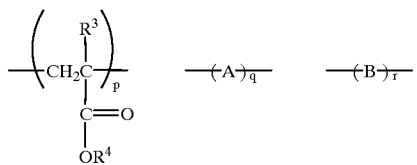

(II)

wherein $R^3$ represents a hydrogen atom or a methyl group; $R^4$ represents a straight or branched alkyl group having 1 to 20 carbon atoms or an aryl group; A represents a vinyl monomer unit having a carboxyl group, a sulfo group, a hydroxyl group, or a salt thereof, or an amide group at the side chain; B represents a copolymerizable monomer unit; p is 10 to 90% by weight; q is 90 to 10% by weight and r is 0 to 50% by weight, and a water-soluble vinyl polymer having a carboxylic acid ester group represented by the following formula (III) as a recurring unit:

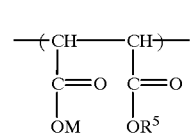

(III)

wherein $R^5$ represents a straight or branched alkyl group having 1 to 20 carbon atoms or an aryl group; and M represents a hydrogen atom, an alkali metal or an ammonium group, being contained between said aluminum support and said silver halide emulsion layer.

2. The lithographic printing plate according to claim 1, wherein the physical development nuclei layer contains at least one selected from the group consisting of a phosphoric acid compound having a polyoxyalkylene unit, a water-soluble vinyl polymer having a carboxylic acid ester group represented by the formula (II) and a water-soluble vinyl polymer having a carboxylic acid ester group represented by the formula (III) as a recurring unit.

3. The lithographic printing plate according to claim 1, wherein said phosphoric acid compound having a polyoxyalkylene unit is a compound represented by the formula (I):

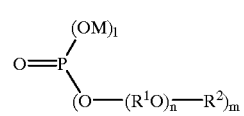

(I)

wherein $R^1$ represents an alkylene group having 2 to 6 carbon atoms; $R^2$ represents an alkyl group having 5 to 20 carbon atoms, an alkenyl group, an alkynyl group or an aryl group which may have a substituent; M represents a hydrogen atom, an alkali metal or an ammonium group; l is an integer of 0, 1 or 2; m is an integer of 1 to 3; l+m=3; and n is an integer of 2 to 30; and when l or m is 2 or more, the respective $R^1$, $R^2$, M and n may be the same or different from each other.

4. The lithographic printing plate according to claim 1, wherein said polyoxyalkylene unit of a phosphoric acid compound having a polyoxyalkylene unit is a polyoxyethylene.

5. The lithographic printing plate according to claim 1, wherein said phosphoric acid compound having a polyoxyalkylene unit is a phosphoric acid ester of a polyoxyethylene alkyl ether or a polyoxyethylene aryl ether, or a salt thereof.

6. The lithographic printing plate according to claim 1, wherein the water-soluble vinyl polymer having a carboxylic acid ester group represented by the formula (II) is a copolymer of a vinyl monomer having a carboxylic acid ester group and a water-soluble vinyl monomer.

7. The lithographic printing plate according to claim 6, wherein the vinyl monomer having a carboxylic acid ester group is at least one selected from the group consisting of an acrylic acid ester and a methacrylic acid ester each having 1 to 10 carbon atoms.

8. The lithographic printing plate according to claim 6, wherein the vinyl monomer having a carboxylic acid ester group is at least one selected from the group consisting of an acrylic acid ester and a methacrylic acid ester each having an alkyl group having 1 to 8 carbon atoms.

9. The lithographic printing plate according to claim 1, wherein the polymer has a weight average molecular weight of about 5,000 to about 1,000,000.

10. The lithographic printing plate according to claim 1, wherein the polymer has a weight average molecular weight of about 10,000 to about 500,000.

\* \* \* \* \*